United States Patent
Krishnan et al.

(10) Patent No.: US 9,548,381 B1
(45) Date of Patent: Jan. 17, 2017

(54) METHOD AND STRUCTURE FOR III-V NANOWIRE TUNNEL FETS

(71) Applicant: GLOBALFOUNDRIES INC., Grand Cayman (KY)

(72) Inventors: Siddarth A. Krishnan, Peekskill, NY (US); Unoh Kwon, Fishkill, NY (US); Vijay Narayanan, New York, NY (US); Jeffrey W. Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/967,946

(22) Filed: Dec. 14, 2015

(51) Int. Cl.
| | |
|---|---|
| *H01L 29/45* | (2006.01) |
| *H01L 29/267* | (2006.01) |
| *H01L 29/66* | (2006.01) |
| *H01L 29/06* | (2006.01) |
| *H01L 29/786* | (2006.01) |

(52) U.S. Cl.
CPC ..... *H01L 29/66977* (2013.01); *H01L 29/0673* (2013.01); *H01L 29/267* (2013.01); *H01L 29/66742* (2013.01); *H01L 29/78618* (2013.01); *H01L 29/78648* (2013.01); *H01L 29/78681* (2013.01); *H01L 29/78696* (2013.01)

(58) Field of Classification Search
CPC .. H01L 29/785; H01L 29/7391; H01L 29/778; H01L 29/335; H01L 29/78696; H01L 29/78681; H01L 29/78648; H01L 29/78618; H01L 29/66742; H01L 29/0673; H01L 29/66977; H01L 29/045; H01L 29/0665; H01L 29/267; H01L 29/66356
See application file for complete search history.

(56) References Cited

U.S. PATENT DOCUMENTS

| | | | | |
|---|---|---|---|---|
| 2010/0327319 | A1* | 12/2010 | Iacopi | H01L 29/7391 257/192 |
| 2011/0168982 | A1* | 7/2011 | Bangsaruntip | B82Y 10/00 257/38 |
| 2014/0175509 | A1* | 6/2014 | Chu-Kung | H01L 29/66393 257/183 |
| 2015/0041847 | A1* | 2/2015 | Kotlyar | H01L 29/785 257/105 |

OTHER PUBLICATIONS

Li, R., et al., "AlGaSb/InAs Tunnel Field-Effect Transistor With On-Current of 78 µA/µm at 0.5 V", IEEE Electron Device Letters, Mar. 2012, pp. 363-365, vol. 33, No. 3.
(Continued)

*Primary Examiner* — Fazli Erdem
(74) *Attorney, Agent, or Firm* — Scully Scott Murphy and Presser; Frank Digiglio

(57) ABSTRACT

A heterojunction tunnel field effect transistor (TFET) has a channel region that includes a first portion of a nanowire, a source region and a drain region that respectively include a second portion and a third portion of a nanowire, and a gate that surrounds the channel region, where the first portion of the nanowire comprises an intrinsic, epitaxial III-V semiconductor. The TFET can be made by selectively etching the epitaxial underlayer to define a tethered (suspended) nanowire that forms a channel region of the device. Source and drain regions can be formed from regrown p-type and n-type epitaxial layers.

8 Claims, 5 Drawing Sheets

(56) References Cited

OTHER PUBLICATIONS

Mohata, D. K., et al., "Demonstration of Improved Heteroepitaxy, Scaled Gate Stack and Reduced Interface States Enabling Heterojunction Tunnel FETs with High Drive Current and High On-Off Ratio", 2012 Symposium on VLSI Technology Digest of Technical Papers, Jun. 12-14, 2012, pp. 53-54.

Dewey, G., "Fabrication, Characterization, and Physics of III-V Heterojunction Tunneling Field Effect Transistors (H-TFET) for Steep Sub-Threshold Swing", Electron Devices Meeting (IEDM), 2011 IEEE International, Dec. 5-7, 2011, pp. 33.6.1-33.6.4.

* cited by examiner

METHOD AND STRUCTURE FOR III-V NANOWIRE TUNNEL FETS

BACKGROUND

The present application relates generally to tunnel field-effect transistor (TFET) devices, and more specifically to heterojunction TFETs and their methods of manufacture.

Operation of a tunnel field-effect transistor is based on electron tunneling, which, in principle, is capable of switching on and off below the theoretical subthreshold swing (SS) of 60 mV/decade at room temperature that is attributable to thermionic carrier injection in the case of a conventional metal oxide semiconductor field effect transistor (MOSFET). The use of TFETs is therefore expected to reduce the power consumption of electronic devices.

A TFET device structure includes a p-i-n (p-type, intrinsic, n-type) junction wherein the electrostatic potential of the intrinsic region is controlled by a gate terminal. The device is operated by applying a gate bias so that electron accumulation occurs in the intrinsic region. At sufficient gate bias, band-to-band tunneling (BTBT) occurs as the conduction band of the intrinsic region aligns with the valence band of the p-type region. Electrons from the valence band of the p-type region tunnel into the conduction band of the intrinsic region and currents flow across the device. When the gate bias is reduced, the bands become misaligned and the current flow ceases.

In view of the short-channel effect, off leakage current suppression of nanowire FETs, and their capability of providing a subthreshold swing that is not limited to kT/q (where k is the Boltzmann constant, T is absolute temperature, and q is the magnitude of the electrical charge on an electron), such devices have become candidates for the next-generation very large scale integration (VLSI) device. In view of the foregoing, it would be advantageous to provide a nanowire TFET whose structure and method of manufacture are readily fabricated with complementary metal oxide semiconductor (CMOS) compatible technology.

SUMMARY

In accordance with embodiments of the present application, disclosed is a horizontal p-i-n nanowire heterojunction TFET. Manufacture of the disclosed TFET is compatible with CMOS processing and particularly fits into FinFET integration. An example nanowire TFET comprises a horizontal nanowire channel that is encapsulated along a channel region by a gate oxide.

In various embodiments of the present application, a tunnel field effect transistor comprises a channel region comprising a first portion of a nanowire, a source region and a drain region, respectively comprising a second portion and a third portion of the nanowire, and a gate that surrounds the channel region, wherein the first portion of the nanowire comprises an intrinsic III-V semiconductor.

In further embodiments, a tunnel field effect transistor comprises a channel region comprising a nanowire, a source region and a drain region adjacent to and contiguous with respective first and second ends of the nanowire, and a gate that surrounds the channel region, wherein the first portion of the nanowire comprises an intrinsic III-V semiconductor.

A method of making a tunnel field effect transistor comprises forming a III-V semiconductor layer on a crystalline substrate, selectively etching the crystalline substrate with respect to the III-V semiconductor layer to form a suspended nanowire, forming a gate structure encapsulating the suspended nanowire, and forming a source region and a drain region adjacent to respective first and second ends of the nanowire.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
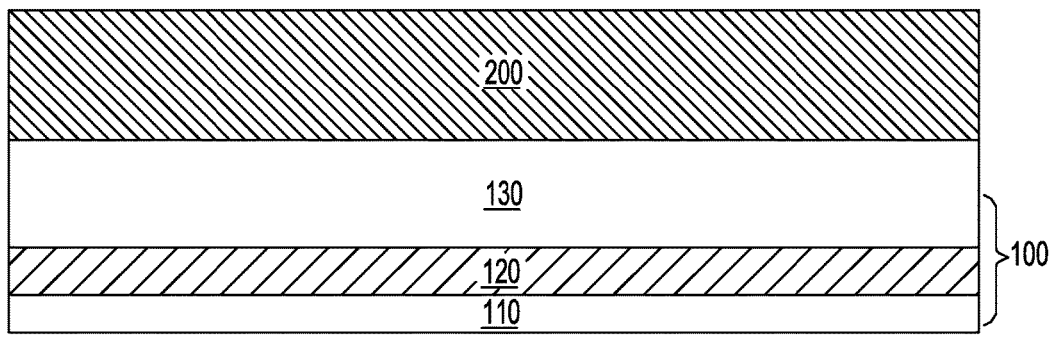
FIG. 1 is a schematic cross-sectional view of a blanket III-V layer formed on a SiGe-on-insulator substrate.

Reference will now be made in greater detail to various embodiments of the subject matter of the present application, some embodiments of which are illustrated in the accompanying drawings. The same reference numerals will be used throughout the drawings to refer to the same or similar parts.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

TFETs comprising III-V nanowire channels are disclosed together with their methods of manufacture. The nanowire channels, which are disposed horizontally within the TFET architecture, provide improved electrostatics relative to conventional devices. Moreover, the disclosed gate-all-around (GAA) geometry is compatible with conventional CMOS process flows.

According to embodiments, a method of forming a TFET having a nanowire channel is discussed below with reference to FIGS. 1-10. FIGS. 1-10 are schematic cross-sectional views depicting the architecture at various stages of the method of the present application. FIGS. 4-10 are schematic cross-sectional views taken transverse to the viewing direction of FIGS. 1-3.

An intrinsic III-V semiconductor layer 200 is formed on a SiGe layer that may include a bulk SiGe substrate (not shown) or, as shown in FIG. 1, a SiGe-on-insulator (SGOI) (e.g., 50% SiGe, a=5.54 A) structure 100. The SGOI structure 100 comprises, from bottom to top a handle substrate 110, an insulator layer 120, and a SiGe layer 130.

Handle substrate 110 may be formed of a suitable semiconducting material, such as silicon, silicon germanium, silicon carbide, gallium arsenide, indium phosphide or the like. Alternatively, handle substrate 110 may be formed of a dielectric material such as silicon oxide. The thickness of the substrate 110 can be selected so as to provide mechanical support to devices formed thereon. In one embodiment, the substrate thickness can be 50 microns to 2 mm, though lesser and greater thicknesses can be used.

The insulator layer 120 may be a crystalline or non-crystalline oxide or nitride. In one embodiment, the insulator layer 120 is an oxide such as, for example, silicon oxide. In another embodiment, the insulator layer 120 is a nitride such as, for example, silicon nitride or boron nitride. In yet further embodiments, the insulator layer 120 is a multilayer stack of, in any order, silicon oxide and boron nitride.

The handle substrate 110 and the silicon germanium alloy layer 130 may have the same or different crystal orientation. For example, the crystal orientation of the handle substrate 110 and/or the silicon germanium layer may be {100}, {110} or {111}. Other crystallographic orientations besides those specifically mentioned may be used in the present application. The handle substrate 110 may be a single crystal semiconductor material, a polycrystalline material, or an amorphous material. Typically, the silicon germanium alloy layer 130 is a single crystal silicon germanium alloy.

SiGe-on-insulator substrates may be formed, for example, using a separation-by-implanted-oxygen (SIMOX) technique or a layer transfer technique may be used. When a layer transfer process is used, an optional thinning step may follow the bonding of two semiconductor wafers together. The thinning step reduces the thickness of the silicon germanium layer to a layer having a thickness that is more desirable.

In another example, the SGOI substrate can be formed by first providing a silicon-on-insulator (SOI) substrate. A sacrificial silicon germanium alloy layer having a specific germanium content can be epitaxially formed (i.e., grown or deposited) on the silicon layer of the SOI substrate. A thermal condensation process may then be performed to provide the SGOI substrate used in providing the exemplary semiconductor structure. Thermal condensation includes heating in an oxidizing environment and at a temperature from 800° C. to 1300° C. Thermal condensation causes Ge diffusion from the sacrificial silicon germanium alloy into the silicon layer of the SOI layer thus converting the silicon layer into the silicon germanium alloy layer mentioned above.

In some embodiments, the thickness of silicon germanium alloy layer 130 is from 10 nm to 100 nm. Other thicknesses that are lesser than or greater than the aforementioned thickness range may also be used. The insulator layer 120 typically has a thickness from 1 nm to 200 nm. Other thicknesses that are lesser than or greater than the aforementioned thickness range may also be used as the thickness of the insulator layer 120. The thickness of the handle substrate 110 is inconsequential to the present application.

The SiGe layer 130 may comprise a strained layer, a relaxed layer, or a combination thereof. For instance, compressively strained $Si_{1-y}Ge_y$ grown on relaxed $Si_{1-x}Ge_x$ structure (y>x) may provide enhanced hole mobility for certain transistor architectures. A strained SiGe layer may be compressive or tensile. In embodiments, the germanium content of the SiGe layer 130 may be 40 to 80 atomic % germanium.

Alternatives to SiGe are other high-quality crystalline semiconductor materials that are both well lattice-matched and CTE-matched to the III-V material, and which can be selectively etched with respect to the III-V material. In embodiments, the lattice mismatch and coefficient of thermal expansion (CTE) mismatch are each less than 10%. As deposited, the III-V semiconductor layer 200 may comprise intrinsic III-V material. The III-V semiconductor layer 200 may be an epitaxial layer. Epitaxial growth may be carried out using an MBE process, an e-beam process, a metal organic chemical vapor deposition (MOCVD) process, a metal organic vapor phase epitaxy (MOVPE) process, or a pulsed laser deposition (PLD) process. Alternate deposition methods may also be employed, as will be appreciated by those of ordinary skill in the art. Example III-V layer materials include GaAs, GaP, GaN, GaAlAs, InGaAs, InAlAs, InP, and InAs (e.g., a=6.058 A).

Figure 2:
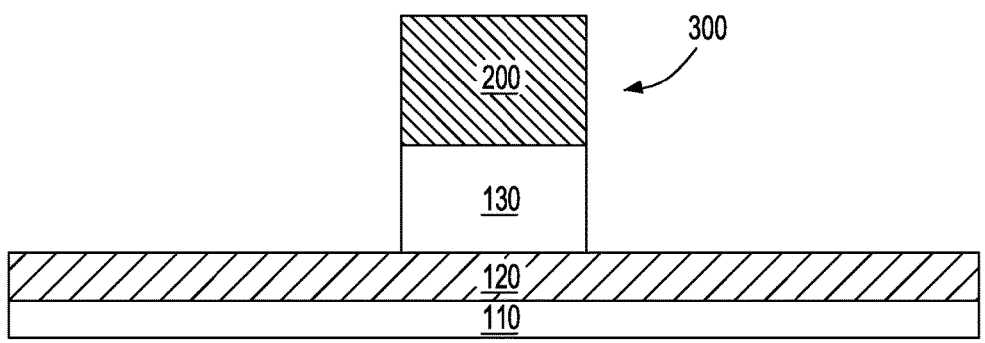
FIG. 2 shows the III-V layer-SiGe layer stack of FIG. 1 patterned into a fin.
Figure 3:
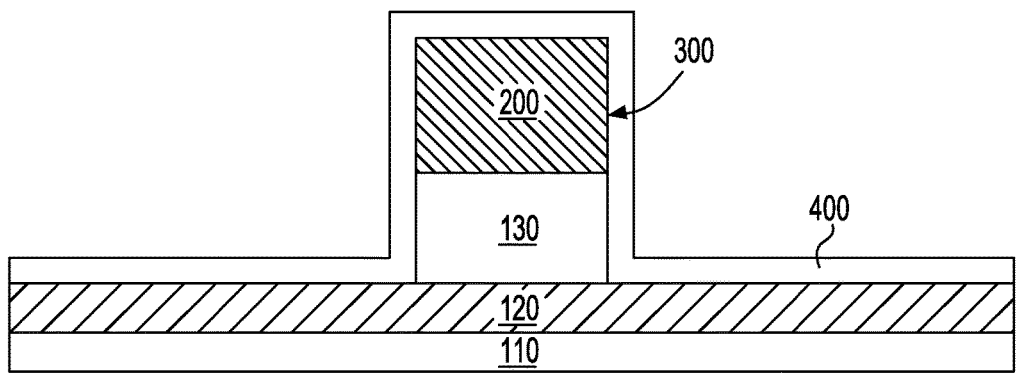
FIG. 3 shows a sacrificial oxide layer disposed over the fin structure and field oxide of FIG. 2.

As illustrated in FIG. 2, the III-V semiconductor layer/SiGe stack is patterned into a fin 300, over which is formed a conformal, sacrificial dielectric layer 400 such as, for example, a dielectric metal oxide (e.g., $Al_2O_3$) (FIG. 3).

The patterning process used to define the fin 300 may include lithography and etching. Lithography includes forming a photoresist material (not shown) atop a material or material stack to be patterned. In the present application, the photoresist material is formed atop the III-V semiconductor layer 200. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. The pattern provided by the patterned photoresist material is thereafter transferred into the underlying material layer or material layers (i.e., III-V semiconductor layer/SiGe stack) utilizing at least one pattern transfer etching process. Typically, the at least one pattern transfer etching process includes an anisotropic etch. In one embodiment, a dry etching process such as, for example, reactive ion etching (RIE) can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers (i.e., III-V semiconductor layer/SiGe stack) that are to be patterned. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material, in the present case a III-V semiconductor layer/SiGe stack, and includes a pair of vertical sidewalls that are parallel to each other. As used herein, a surface is "vertical" if there exists a vertical plane from which the surface does not deviate by more than three times the root mean square roughness of the surface. In one embodiment of the present application, each fin has a height that is from 10 nm to 100 nm and a width that is from 4 nm to 30 nm. Other heights and widths that are lesser than or greater than the ranges mentioned can also be used. In structures comprising plural fins, each fin is spaced apart from its nearest neighbor by a pitch of from 20 nm to 100 nm. Such plural fins are typically oriented parallel to each other. A shown, each III-V semiconductor layer/SiGe fin has a bottom surface that is disposed directly on a top surface of the insulator layer 120.

Thus, as shown edge-on in FIGS. 2 and 3, the fin 300 includes, from bottom to top, a remaining portion of the SiGe layer 130 and a remaining portion of the III-V layer 200. The sacrificial dielectric layer 400 can be formed by a deposition process such as, for example, chemical vapor deposition or plasma enhanced chemical vapor deposition over the top surface and sidewall surfaces of the fin 300, as well as over the exposed surface of the insulator layer 120.

Next, a gate-last replacement metal gate (RMG) process is performed. This includes forming a sacrificial gate layer over the sacrificial dielectric layer and then patterning the sacrificial dielectric layer and the sacrificial gate layer into a sacrificial gate structure. The sacrificial gate layer may be formed utilizing a conventional deposition process such as, for example, CVD or PECVD. The patterning may be performed by lithography and etching as defined above. The sacrificial gate layer may comprise poly-silicon.

Figure 4:
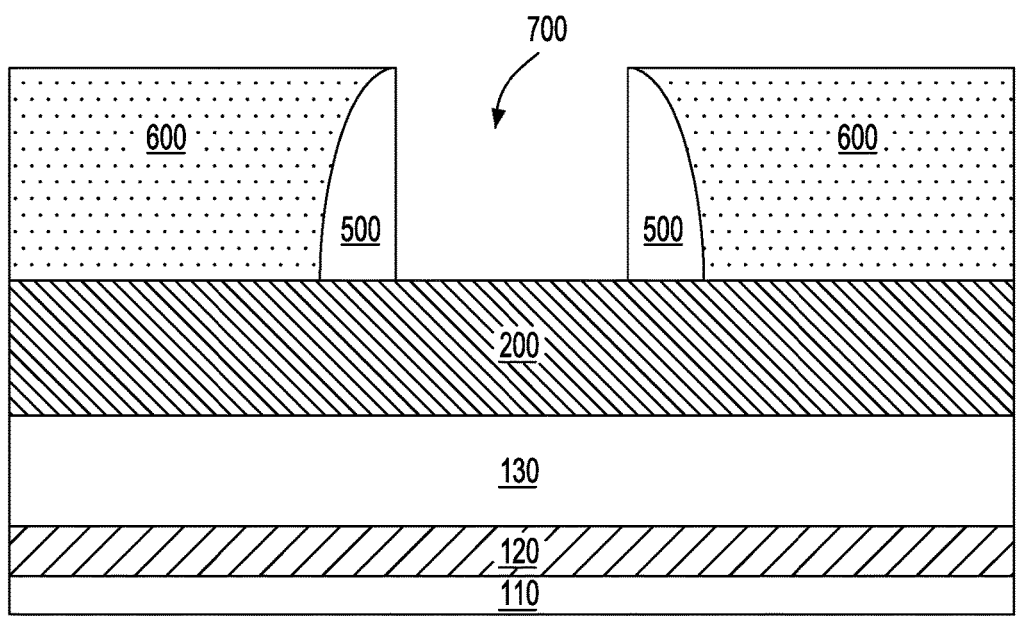
FIG. 4 is view transverse to the prior views showing a cross-section of the structure comprising dielectric spacers and an interlayer dielectric following a channel region-defining replacement metal gate process and removal of the sacrificial oxide layer.

Dielectric spacers 500 and an interlayer dielectric (ILD) layer 600 are formed over the sacrificial gate layer and then planarized back to the height of the sacrificial gate structure, which is then removed. The resulting architecture with a defined opening 700 is shown in FIG. 4. Example dielectric spacer materials include, but are not limited to, a dielectric nitride and a dielectric oxide. In one embodiment, the dielectric spacer is composed of silicon nitride. The thickness of the dielectric spacer can be from 3 nm to 100 nm, although lesser and greater thicknesses can also be employed.

Referring still to FIG. 4, an anisotropic etch is performed to remove horizontal portions of the dielectric spacer material. The anisotropic etch can be, for example, reactive ion etching (RIE). As described further below, remaining vertical portions of the dielectric spacer 500 constitute a gate spacer present on sidewalls of a gate stack (800, 820). The gate stack (800, 820) and the dielectric spacer 500 together define a gate structure.

The ILD layer 600 may comprise any dielectric material including, for example, oxides, nitrides or oxynitrides. In one embodiment, the ILD layer 600 includes silicon dioxide. The ILD layer 600 may be formed, for example, by CVD or spin-coating. The ILD layer 600 may be self-planarizing, or the top surface of the ILD 600 can be planarized, for example, by chemical mechanical planarization (CMP).

It is noted that the opening 700 will be used to define a channel region of the resultant TFETs of the present application. As an alternative to the illustrated gate-last process flow, it will be appreciated that the disclosed nanowire TFETs can be manufactured using a gate-first process flow.

Figure 5:
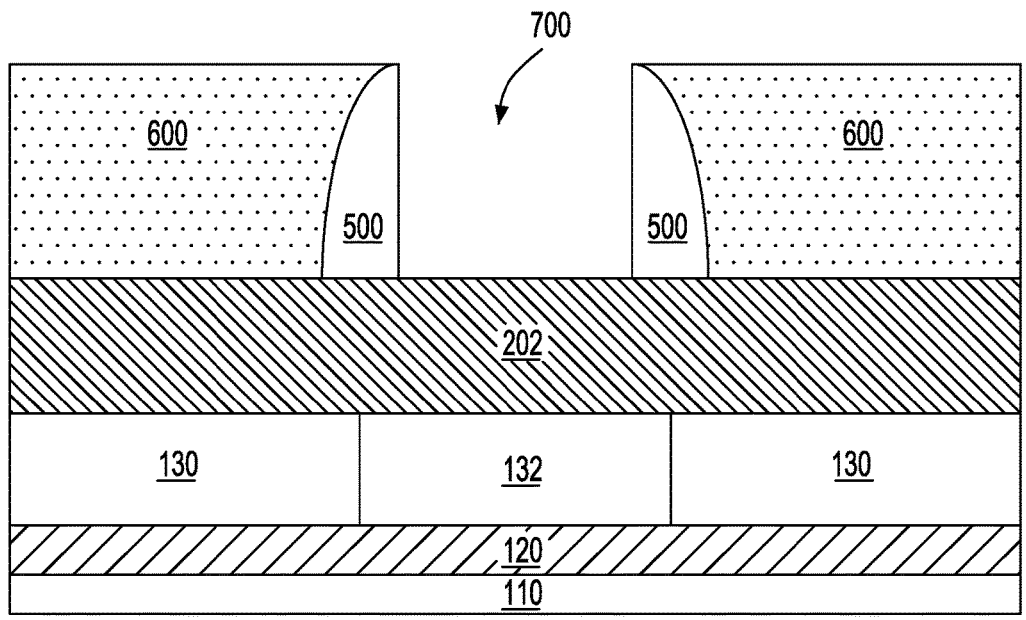
FIG. 5 shows a tethered III-V nanowire formed across the channel region via the selective etching of SiGe.

The SiGe layer 130, which is unmasked by the interlayer dielectric 600 within the opening 700, is selectively etched to form a tethered (suspended) III-V nanowire 202. A wet etch comprising HCl, for example, can be used to selectively etch SiGe and form tunnel 132. Tunnel 132 is bounded above and below by the tethered III-V nanowire 202 and the insulating layer 120, respectively, and laterally by the SiGe layer 130. Thus, as seen in FIG. 5, within the opening 700, the tethered nanowire 202 is exposed along its periphery. Outside of the opening 700, the nanowire is anchored between the SiGe layer 130 and the interlayer dielectric 600.

Exposed surfaces of tethered nanowire 202 may be smoothed by, for example, annealing in hydrogen. Tethered nanowire 202 may have a rectangular or non-rectangular vertical cross-sectional shape along planes perpendicular to its length. For example, the nanowire 202 can have a circular or elliptical vertical cross-sectional shape. An oxidation process may be performed to reduce the nanowire diameter to desired dimensions. In embodiments, the tethered nanowire 202 has cross-sectional dimensions ranging from 40 to 100 nm, though larger and smaller dimensions may be used.

Figure 6:
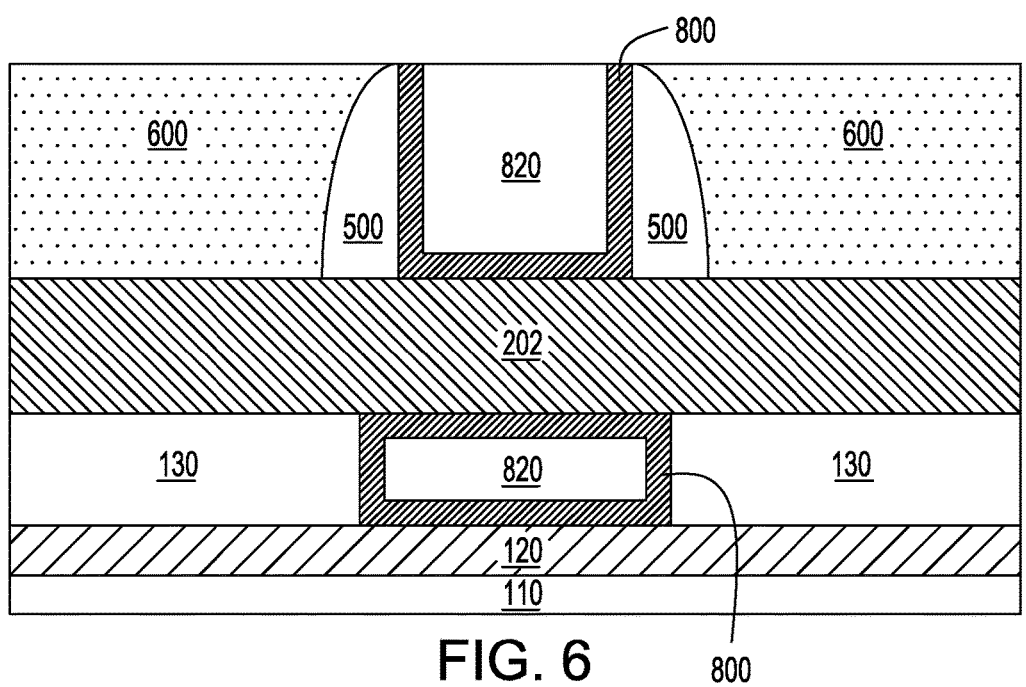
FIG. 6 shows the nanowire encapsulated within the channel region via the conformal deposition of a high-k gate oxide.

With reference to FIG. 6, a high-k dielectric 800 and a gate conductor 820 are successively deposited within opening 700 to form a gate stack that encapsulates the exposed portion of the nanowire 202. The device has a GAA geometry. In some embodiments, gate conductor 820 comprises both a work function metal that is deposited onto the high-k dielectric 800 and a fill metal that is deposited onto the work function metal. A conformal deposition process such as an atomic layer deposition (ALD) or chemical vapor deposition (CVD) process can be used to deposit the high-k dielectric, work function metal, and fill metal.

In embodiments, a high-k dielectric material has a dielectric constant of at least 4. Example high-k dielectric materials include, but are not limited to: $HfO_2$, $ZrO_2$, $La2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2.

Example work function metals include titanium nitride (e.g., TiN) and titanium aluminum carbide (e.g., TiAlC). Example fill metals are aluminum (Al) and tungsten (W) though any suitable conductive material may be used. Dielectric spacers 500 are located adjacent to the gate. The gate dielectric thickness can range from 0.9 nm to 6 nm, though lesser and greater thicknesses can be used. The thickness of the gate electrode layers can be from 100 nm to 500 nm, though lesser and greater thicknesses can be used.

The interlayer dielectric 600 is removed exposing portions of the nanowire 202 not covered by the dielectric spacer 500, high-k dielectric 800 and gate conductor 820. The exposed portions of the nanowire 202 are subsequently processed to include a source region and a drain region of the inventive TFET. In the embodiment illustrated in FIG. 7, element 240 refers to a source side of the inventive TFET structure, while element 260 refers to a drain side of the inventive TFET structure. In one embodiment, the source region and drain region can be ion implanted to form respective p-type and n-type source and drain regions. Ions may be implanted in each of the source region and the drain region, for example, by forming a protective mask over the gate and opposing region prior to ion implantation. Source region may be doped with p-type dopants such as Be, Mg, Zn, Cd, Si or Ge. Drain region may be doped with n-type dopants such as S, Se, Te, Si or Ge.

Figure 7:
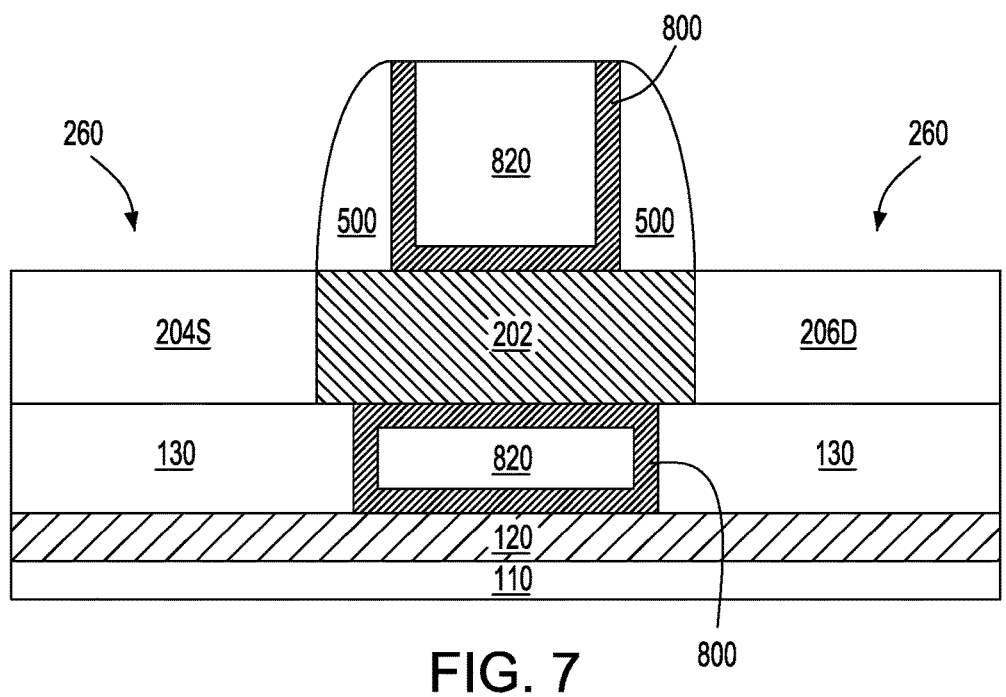
FIG. 7 shows the removal of the interlayer dielectric and reformation of p-type III-V source and drain regions.
Figure 8:
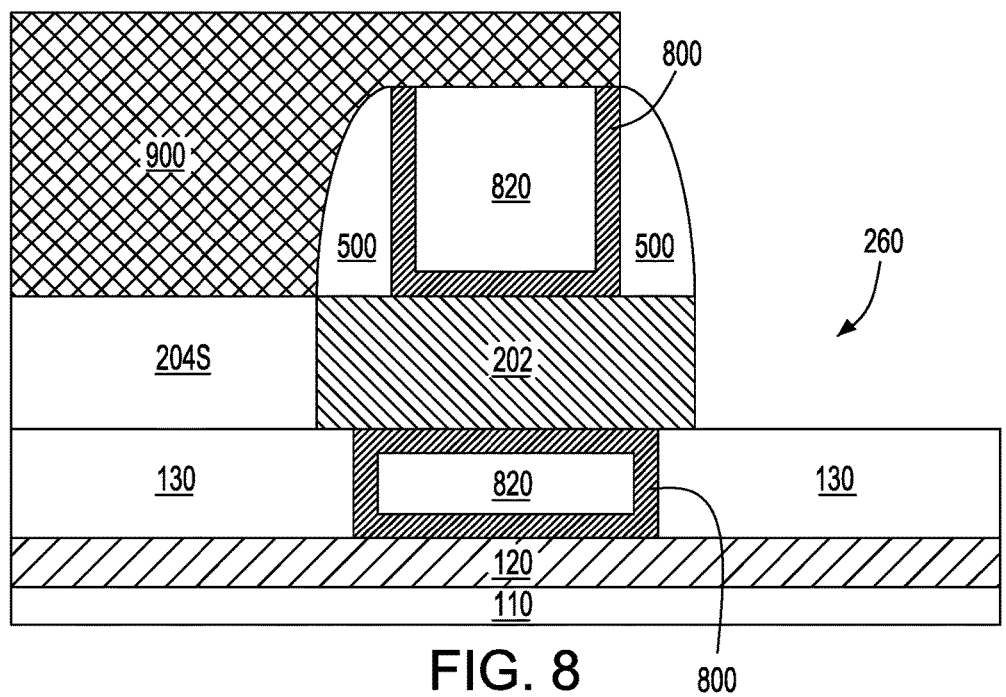
FIG. 8 shows a photolithography mask and removal of III-V material from the drain region.
Figure 9:
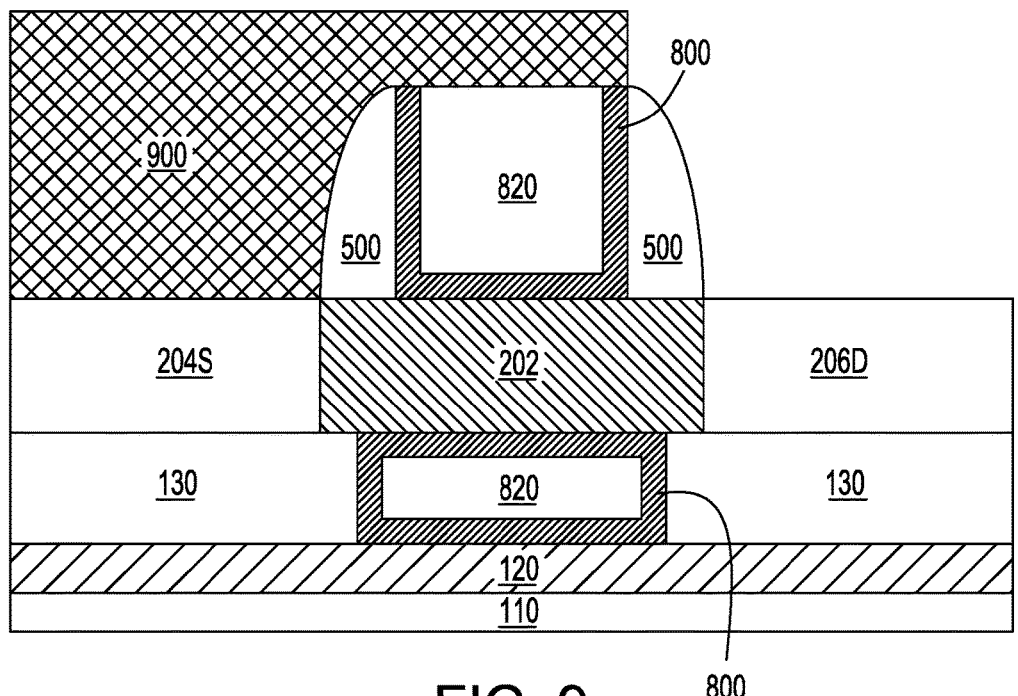
FIG. 9 shows n-type III-V material regrown in the drain region.

In a further embodiment, the source region 204S and the drain region 204D are recessed to the SiGe layer 130, followed by regrowth of doped (e.g., p-type) III-V material in each region (FIG. 7). In such an approach, p-type material is initially simultaneously deposited in each of the source region and drain region. Then, as shown in FIGS. 8 and 9, a mask 900 is used to block the source region 204S in order to etch out the drain region 204D and regrow n-type III-V material in the drain region 206D.

With reference to FIG. 7, a first epitaxial semiconductor region 204S is formed adjoined to a first side of the gate structure (800, 820, 500) by a first selective epitaxial growth process. The first epitaxial semiconductor region 204S merges adjacent nanowire 202 at a first end thereof. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface.

A second epitaxial semiconductor region 206D is formed adjoined to a second side of the gate structure (800, 820, 500) by a second selective epitaxial growth process. The second epitaxial semiconductor region 206D merges adjacent nanowire 202 at a second end thereof. The first epitaxial semiconductor region 204S can function as a source region and the second epitaxial semiconductor region 206D can function as a drain region for a nanowire FET. Due to the direct bandgap and higher tunneling efficiency, III-V semiconductor materials are preferred material of choice as the source and drain regions for nanowire TFETs.

Figure 10:
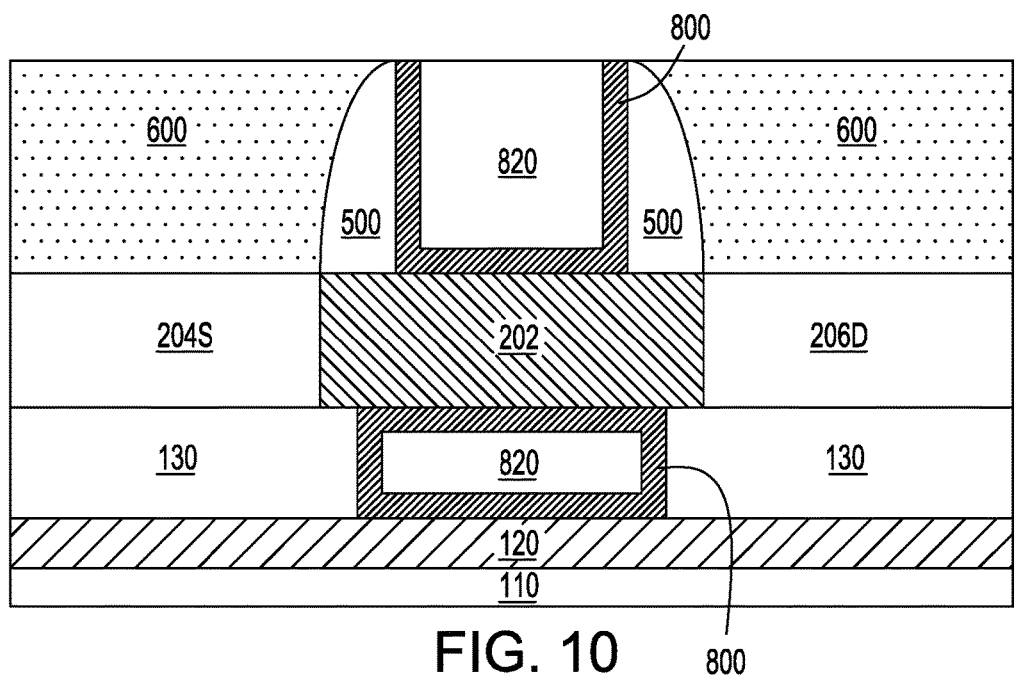
FIG. 10 shows a planarized interlayer dielectric formed over the reformed source and drain regions of a p-i-n nanowire heterojunction TFET.

Once the source region and drain region are formed, the doping may be activated by, for example, a laser or flash anneal. Following removal of the mask 900 and deposition of interlayer dielectric layer 600, chemical mechanical polishing can be used to planarize the structure, e.g., back to the height of the metal fill. As shown in FIG. 10, the structure comprises a horizontal p-i-n single nanowire heterojunction TFET. As used herein, a heterojunction is the interface that occurs between two layers or regions of dissimilar crystalline semiconductors. These semiconducting materials have unequal band gaps as opposed to a homojunction.

In embodiments, the reformed III-V material in each of the source and drain regions is contiguous with nanowire 202. In embodiments, the reformed III-V material in the source and drain regions have one or both of a top surface and a bottom surface that are co-planar with respective top and bottom surfaces of nanowire 202 in the channel region. The channel region is the portion of nanowire 202 that is located between the p-type source region 204S and the n-type drain region 206D beneath the functional gate structure 800, 820, 500.

The disclosed TFETs exhibit high currents, steep subthreshold slope and good electrostatics and, in addition to being manufacturable in a robust, high-volume manufacturing process, are expected to reduce the power consumption of large-scale integrated circuits (LSIs).

As used herein, the singular forms "a," "an" and "the" include plural referents unless the context clearly dictates otherwise. Thus, for example, reference to a "dielectric layer" includes examples having two or more such "dielectric layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, a layer or region "disposed over" a substrate or other layer refers to formation above, or in contact with, a surface of the substrate or layer. Where it is noted or recited that a layer is disposed over a substrate or other layer, it is contemplated that intervening structural layers may optionally be present between the layer and the substrate.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a nanowire channel that comprises intrinsic III-V material include embodiments where a nanowire channel consists essentially of intrinsic III-V material and embodiments where a nanowire channel consists of intrinsic III-V material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of making a tunnel field effect transistor (TFET), comprising:
   forming a III-V semiconductor layer directly on a SiGe layer of a semiconductor substrate;
   selectively etching the SiGe layer with respect to the III-V semiconductor layer to form a suspended nanowire;
   forming a gate structure encapsulating the suspended nanowire; and
   forming a source region and a drain region adjacent to respective first and second ends of the nanowire.

2. The method of claim 1, wherein the III-V semiconductor layer is an epitaxial layer.

3. The method of claim 1, wherein the III-V semiconductor layer is an intrinsically doped layer.

4. The method of claim 1, wherein forming the source region comprises epitaxially growing p-type semiconductor material, and forming the drain region comprises epitaxially growing n-type semiconductor material.

5. The method of claim 1, wherein the source and drain regions each comprise a top surface that is substantially co-planar with a top surface of the nanowire.

6. The method of claim 1, further comprising defining a channel region by forming a protective mask comprising dielectric spacers and an interlayer dielectric prior to selectively etching the SiGe layer.

7. The method of claim 1, wherein the III-V semiconductor layer comprises a material selected from the group consisting of GaAs, GaP, GaN, GaAlAs, InGaAs, InAlAs, InP and InAs.

8. The method of claim 1, wherein the semiconductor substrate comprises a SiGe-on-insulator substrate.

* * * * *